United States Patent
Arita et al.

(10) Patent No.: US 6,333,528 B1
(45) Date of Patent: *Dec. 25, 2001

(54) SEMICONDUCTOR DEVICE HAVING A CAPACITOR EXHIBITING IMPROVED MOISTURE RESISTANCE

(75) Inventors: Koji Arita, Osaka; Eiji Fujii, Ibaraki; Yasuhiro Shimada, Mishima-gun; Yasuhiro Uemoto, Otsu; Toru Nasu, Kyoto; Akihiro Matsuda; Yoshihisa Nagano, both of Suita; Atsuo Inoue, Otokuni-gun; Taketoshi Matsuura; Tatsuo Otsuki, both of Takatsuki, all of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/071,795

(22) Filed: May 4, 1998

Related U.S. Application Data

(62) Division of application No. 08/844,108, filed on Apr. 28, 1997, now Pat. No. 5,780,351, which is a division of application No. 08/284,984, filed on Aug. 4, 1994, now Pat. No. 5,624,864.

(30) Foreign Application Priority Data

| Aug. 5, 1993 | (JP) | 5-194617 |
| Aug. 5, 1993 | (JP) | 5-194618 |
| Feb. 24, 1994 | (JP) | 6-026514 |
| Mar. 25, 1994 | (JP) | 6-055552 |

(51) Int. Cl.[7] ............ H01L 29/76; H01L 29/00; H01L 23/58; H01L 23/48
(52) U.S. Cl. ............ 257/295; 257/296; 257/532; 257/535; 257/640; 257/649; 257/764
(58) Field of Search .............. 257/295, 296, 257/532, 535, 640, 649, 763, 764, 768, 769, 767, 751

(56) References Cited

U.S. PATENT DOCUMENTS 5,046,043 * 9/1991 Miller et al. ............ 257/295

FOREIGN PATENT DOCUMENTS

| 0 380 326 | 8/1990 | (EP) | 257/295 |
| 0 396 221 | 11/1990 | (EP) | 257/295 |
| 0 495 113 | 7/1992 | (EP) | 257/295 |
| 0 495 114 | 7/1992 | (EP) | 257/295 |
| 0 503 078 | 9/1992 | (EP) | 257/295 |
| 0 513 894 | 11/1992 | (EP) | 257/295 |
| 0 514 547 | 11/1992 | (EP) | 257/295 |
| 61 016 562 | 1/1986 | (JP) | 257/650 |
| 01 265 524 | 10/1989 | (JP) | 257/650 |
| 02 144 915 | 6/1990 | (JP) | 257/650 |
| 02 232 961 | 9/1990 | (JP) | 257/640 |

* cited by examiner

*Primary Examiner*—Steven Loke
(74) *Attorney, Agent, or Firm*—McDermott, Will & Emery

(57) ABSTRACT

A semiconductor device forming a capacitor through an interlayer insulating layer on a semiconductor substrate on which an integrated circuit is formed. This semiconductor device has an interlayer insulating layer with moisture content of 0.5 g/cm$^3$ or less, which covers the capacitor in one aspect, and has a passivation layer with hydrogen content of 10$^{21}$ atoms/cm$^3$ or less, which covers the interconnections of the capacitor in other aspect. By thus constituting, deterioration of the capacitor dielectric can be prevented which brings about the electrical reliability of the ferroelectric layer or high dielectric layer.

2 Claims, 17 Drawing Sheets

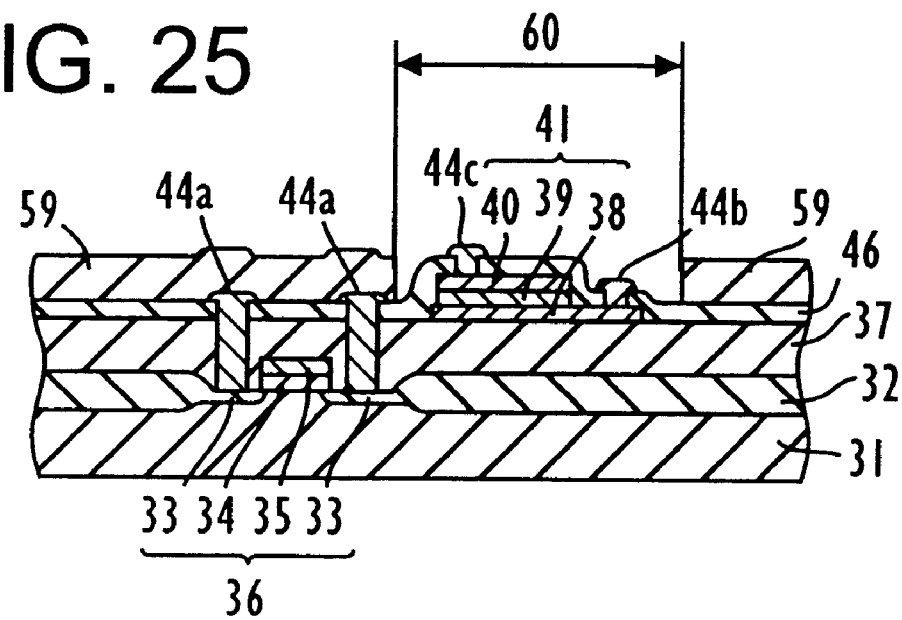
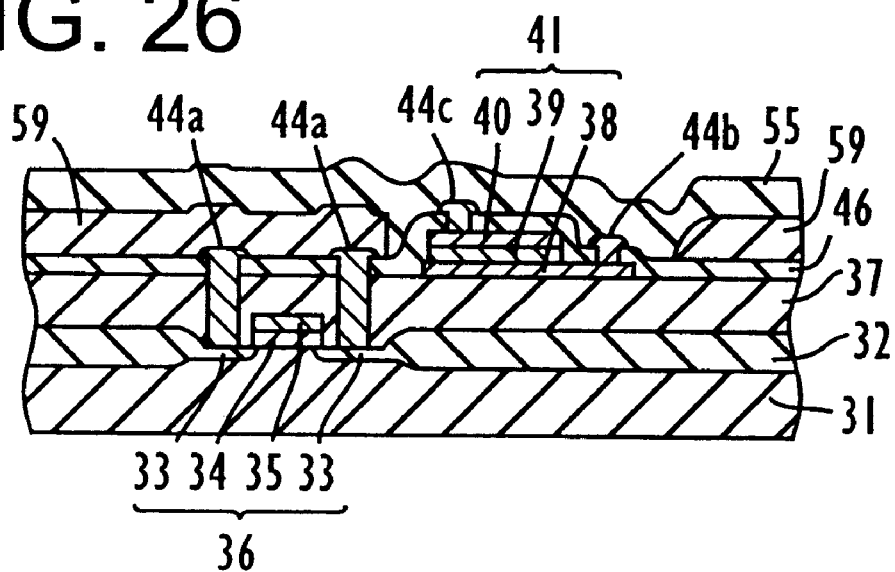

SEMICONDUCTOR DEVICE HAVING A CAPACITOR EXHIBITING IMPROVED MOISTURE RESISTANCE

This is a Divisional of U.S. patent application Ser. No. 08/844,108, filed Apr. 28, 1997, now U.S. Pat. No. 5,780,351, which is a divisional of Ser. No. 08/284,984, filed Aug. 4, 1994, now U.S. Pat. No. 5,624,864, issued Apr. 29, 1997.

FIELD OF THE INVENTION

The present invention relates to a semiconductor device having ferroelectric layer or high dielectric layer as capacitor dielectric layer and a manufacturing method thereof.

BACKGROUND OF THE INVENTION

Recently, along with the trend of higher speed and lower power consumption of semiconductor devices such as microcomputers and digital signal processors electronic appliances for consumer use are more and more advanced in performance, while an electromagnetic interference which is an electromagnetic noise generated from these electronic appliances is posing a serious problem. Accordingly, not only in electronic appliances, but also in semiconductor devices used in them, measures against electromagnetic interference are demanded. The most effective measure against electromagnetic interference in the semiconductor device is to install a capacitor of a large capacitance between the bias line and ground line inside the semiconductor device, hitherto the capacitor was placed outside the semiconductor device.

In addition, lately, nonvolatile random access memories in a simple construction having a capacitor, using a ferroelectric layer as a capacitor dielectric layer, and dynamic random access memories having a capacitors using dielectric layer of a high dielectric constant as storage capacitors have been developed.

A conventional semiconductor device having a capacitor is specifically described below.

FIG. 1 is a partially sectional view of a representative semiconductor device. In FIG. 1, on a silicon substrate 1, an integrated circuit 6 represented by source/drain active areas 3, a gate oxide 4, and a gate electrode 5 is formed in a region enclosed by a filed oxide area 2. Further on the silicon substrate 1, an insulating layer 7 is formed, and in a specific region on the insulating layer 7, a capacitor 11 consisting of a bottom electrode 8, a capacitor dielectric layer 9, and a top electrode 10 is formed. At least covering the capacitor 11, moreover, an interlayer insulating layer 12 is formed. There are also formed interconnections 14a connected to the source/drain active areas 3 through a first contact hole 13a, interconnection 14b connected to the bottom electrode 8 of the capacitor 11 through a second contact hole 13b, and interconnection 14c connected to the top electrode 10 of the capacitor 11 through a third contact hole 13c. Furthermore, a passivation layer 15 is formed in order to protect the interconnections 14a, 14b, 14c.

A manufacturing method of the conventional semiconductor device having capacitor shown in FIG. 1 is explained below while referring to the flow chart of manufacturing process shown in FIG. 2, together with FIG. 1. First, at step (1), the integrated circuit 6 is formed on the silicon substrate 1. At step (2), an insulating layer 7 is formed on a silicon substrate 1. At step (3), a capacitor 11 is formed on the insulating layer 7. This capacitor 11 is formed by sequentially laminating a first conductive layer as bottom electrode 8, capacitor dielectric layer 9, and a second conductive layer as top electrode 10, and patterning respectively by etching. As the capacitor dielectric layer 9, a ferroelectric layer or high dielectric layer is used, and as bottom electrode 8 and top electrode 10, a two-layer composition consisting of platinum layer and titanium layer sequentially from the side contacting with the capacitor dielectric layer 9 is used. At step (4), an interlayer insulating layer 12 composed of PSG (phospho-silicate glass) is formed by CVD so that at least the capacitor 11 is covered. At step (5), a first contact hole 13a reaching the source/drain active areas 3 of the integrated circuit 6, a second contact hole 13b reaching the bottom electrode 8 of the capacitor 11, and a third contact hole 13c reaching the top electrode 10 of the capacitor 11 are formed. After forming interconnections 14a, 14b, 14c at step (6), a passivation layer 15 composed of silicon nitride layer or silicon oxynitride layer of high humidity resistance is formed by plasma CVD at step (7).

However, in such conventional semiconductor device having capacitor, a PSG layer is used as interlayer insulating layer 12, and although the purpose of alleviating the stress to the capacitor 11 is achieved, the moisture generated when forming the PSG layer by CVD is absorbed by the PSG layer, and this moisture diffuses into the ferroelectric layer comprising the capacitor dielectric layer, thereby lowering the electric resistance. This phenomenon gives rise to increase of leakage current of the capacitor 11 or decline of dielectric strength, which may induce dielectric breakdown of the capacitor dielectric layer 9.

Yet, in such conventional semiconductor device having capacitor, as a passivation layer 15, silicon nitride layer or silicon oxynitride layer formed by plasma CVD is used, and although invasion of moisture from outside into the capacitor 11 may be prevented, activated hydrogen is generated in the layer forming process by plasma CVD, and this activated hydrogen may diffuse in the ferroelectric layer or high dielectric layer for composing the capacitor dielectric layer 9, which may induce increase of leakage current of the capacitor 11 or deterioration of electrical characteristics. Generally, the hydrogen atom content in the nitride layer formed by plasma CVD is as high as $10^{22}$ atoms/cm$^3$, and by heat treatment after layer forming, diffusion of hydrogen into the capacitor dielectric layer 9 is accelerated, and the characteristic of the capacitor 11 is further degenerated.

SUMMARY OF THE INVENTION

It is hence a primary object of the invention to present a semiconductor device having capacitor with high reliability. It is another object thereof to present a manufacturing method of such semiconductor device without deteriorating the integrated circuit formed on a semiconductor substrate.

In an embodiment of the semiconductor device of the invention, a capacitor consisting of bottom electrode, capacitor dielectric layer, and top electrode is formed on an insulating layer on a semiconductor substrate in which an integrated circuit is fabricated, and it is constituted that the moisture content in the interlayer insulating layer which covers this capacitor may not exceed 0.5 g as converted to 1 cm$^3$ of the interlayer insulating layer.

According to this constitution, diffusion of moisture into the capacitor dielectric layer can be suppressed, and lowering of dielectric strength of the capacitor dielectric layer can be prevented, and hence it has been confirmed that the reliability is enhanced.

In another embodiment of the semiconductor device of the invention, the passivation layer which covers the interconnections is constituted as a silicon nitride layer with the hydrogen atom content of $10^{2\ 1}$ atoms/cm$^3$ or less.

In this constitution, if heated at around 400° C. after forming the silicon nitride layer, the number of hydrogen atoms diffusion into the capacitor dielectric layer is small, and it has been confirmed that characteristic deterioration of the capacitor does not occur.

In another embodiment of the semiconductor device of the invention, as the passivation layer which covers the interconnections, a PSG layer (phosphosilicate glass layer) and NSG layer (non-doped silicate glass layer) are laminated sequentially from the interconnection side.

According to the constitution, different from the silicon nitride layer or silicon oxynitride layer formed by the conventional plasma CVD, since hydrogen is not contained in the passivation layer, the capacitor dielectric layer will not deteriorate. Besides, the stress relaxation on the capacitor can be prevented by the PSG layer, and the moisture absorption which is a demerit of the PSG layer can be prevented by the NSG layer formed thereon, so that stress may not be applied on the capacitor, thereby realizing a high reliability.

In a different embodiment of the semiconductor device of the invention, on the interlayer insulating layer formed on the capacitor, a titanium nitride layer or a titanium-tungsten layer is formed in a shape for covering the capacitor.

In this constitution, the titanium nitride layer or titanium-tungsten layer adheres well to the interlayer insulating layer and is dense, therefore invasion of water into the capacitor dielectric layer is prevented, and deterioration of the capacitor does not occur. In addition to this constitution, by forming a solution nitride layer in other region than the capacitor, invasion of moisture can be prevented without applying stress to the capacitor, and the other regions can be completely protected by the silicon nitride layer.

In an embodiment of manufacturing method of semiconductor device of the invention, aside from the method of manufacturing the semiconductor device described above, it is constituted to heat the capacitor dielectric layer after removing the passivation layer above the capacitor, or the passivation layer and interlayer insulating layer.

In this constitution, the hydrogen alone or hydrogen compound contained in the capacitor dielectric layer can be easily released, so that increase of leakage current and a drop in dielectric strength of the capacitor can be prevented.

BRIEF DESCRIPTION OF THE DRAWINGS

FIG. 8, FIG. 9, and FIG. 10 are partially sectional views showing a manufacturing method of semiconductor device having capacitor in Embodiment 2 of the invention, in which FIG. 8 is a diagram showing the state of forming interconnections by forming a capacitor on an insulating layer of a semiconductor substrate in which an integrated circuit is formed, forming an interlayer insulating layer on the capacitor, and forming contact holes, FIG. 9 is a diagram showing the state of forming a passivation layer for protecting the interconnections, and FIG. 10 is a diagram showing the state of forming a second passivation layer further on the passivation layer in FIG. 9.

FIG. 14, FIG. 15, and FIG. 16 are partially sectional views showing a manufacturing method of semiconductor device having capacitor in Embodiment 3 of the invention, in which FIG. 14 is a diagram showing the state of forming a capacitor on an insulating layer of a semiconductor substrate in which an integrated circuit is formed, forming an interlayer insulating layer on the capacitor, and forming contact holes, FIG. 15 is a diagram showing the state of forming the interconnections, and FIG. 16 is a diagram showing the state of forming two passivation layers to protect the interconnections.

FIG. 18 and FIG. 19 are partially sectional views showing a manufacturing method in Embodiment 4, in which FIG. 18 is a diagram showing the state of forming a second passivation layer possessing an opening corresponding to capacitor after forming interconnections, and FIG. 19 is a diagram showing the state of forming two passivation layers for protecting the interconnections.

FIG. 22, FIG. 23, FIG. 24, FIG. 25, and FIG. 26 are partially sectional views showing a manufacturing method of semiconductor device having capacitor in Embodiment 7 of the invention, in which FIG. 22 is a diagram showing the state of forming a capacitor on an insulating layer of a semiconductor substrate in which an integrated circuit is formed, forming an interlayer insulating layer on the capacitor, and forming contact holes, FIG. 23 is a diagram showing the state of forming the interconnections, FIG. 24 is a diagram showing the state of forming a passivation layer to protect the interconnections, FIG. 25 is a diagram showing the state of forming a second passivation layer possessing an opening corresponding to the top electrode of the capacitor after forming interconnections, and FIG. 26 is a diagram showing the state of forming passivation layers in order to protect the interconnections.

DESCRIPTION OF THE PREFERRED EMBODIMENTS

Embodiment 1

Figure 1:
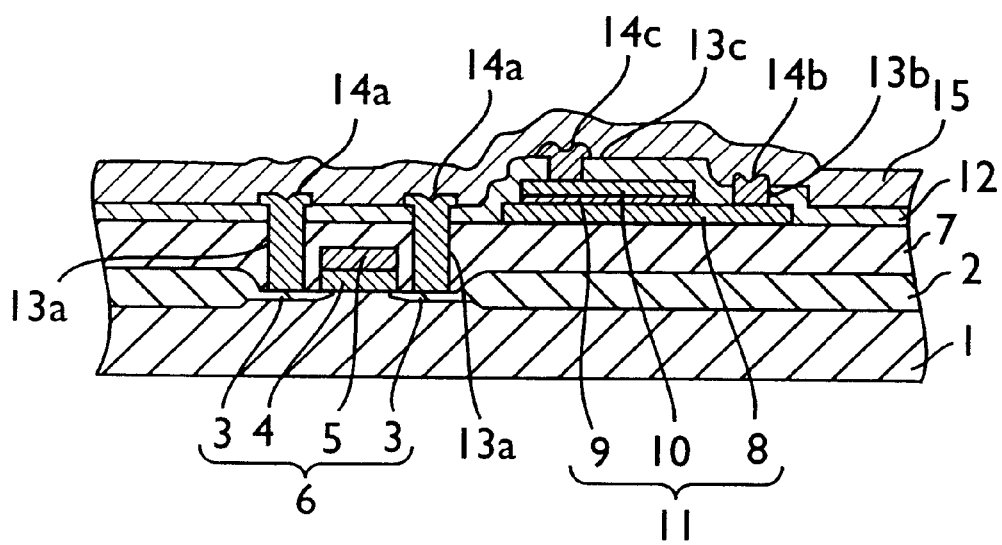
FIG. 1 is a partially sectional view showing the structure of principal parts of a conventional semiconductor device having capacitor.
Figure 2:
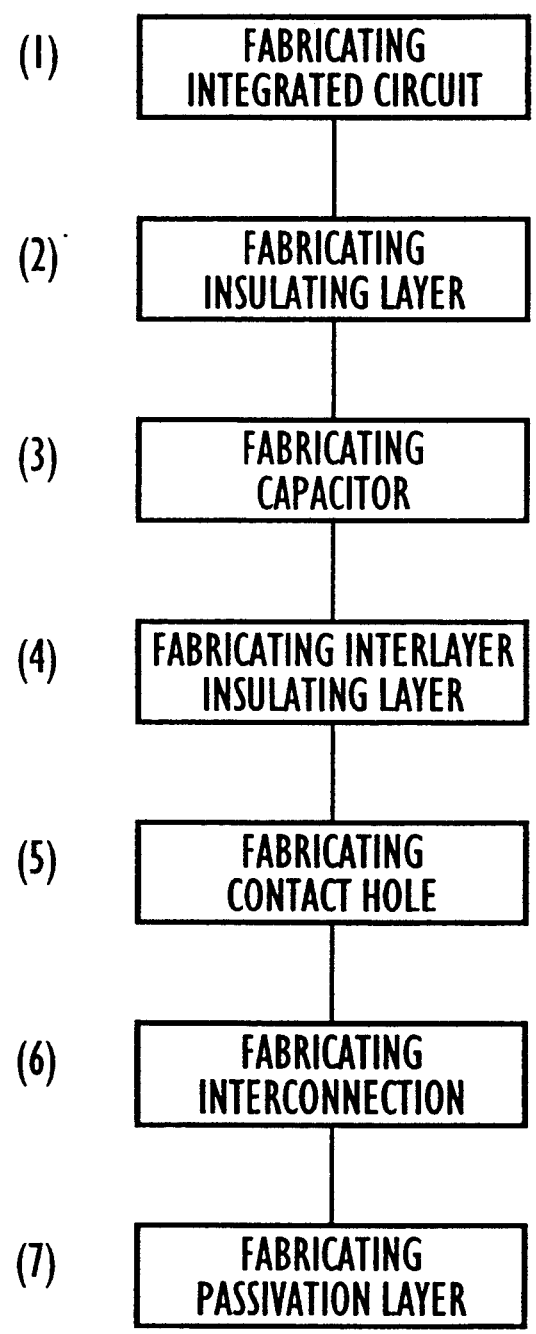
FIG. 2 is a flow chart for explaining a conventional manufacturing method of semiconductor device having capacitor.
Figure 3:
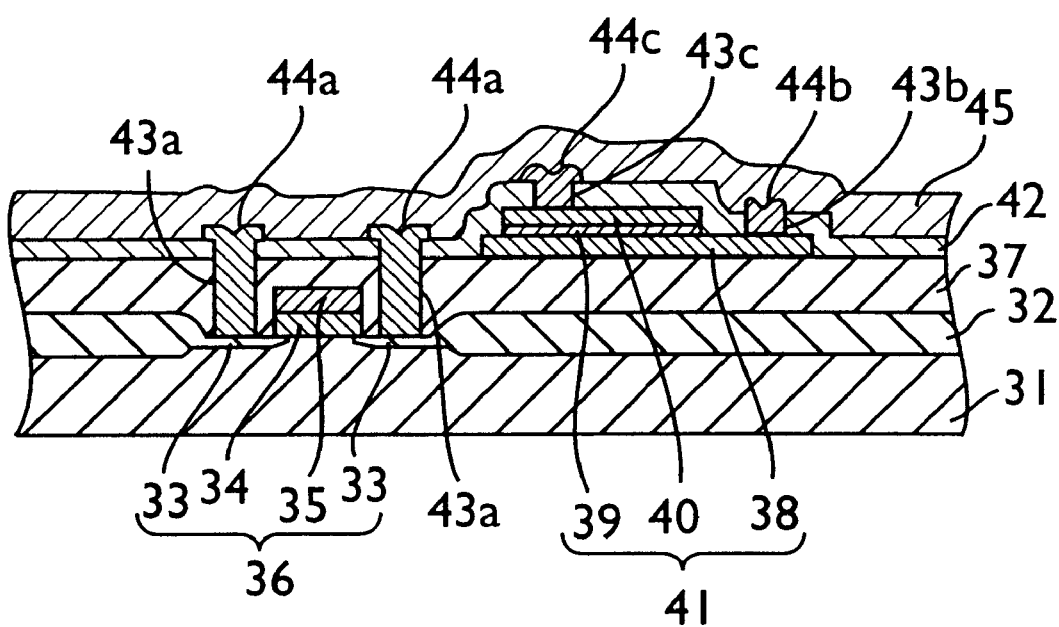
FIG. 3 is a partially sectional view showing the structure of principal parts of a semiconductor device having capacitor in Embodiment 1 of the invention.

In a semiconductor device of the invention shown in FIG. 3, an isolation oxide layer 32 is formed on a silicon substrate 31, and an integrated circuit 36 represented by a transistor composed of a diffusion region 33, a gate insulating layer 34, and a gate electrode 35 is formed in a region enclosed by the isolation oxide layer 32.

On the silicon substrate 31, an insulating layer 37 composed of silicon oxide layer is formed, and a capacitor 41 comprising a bottom electrode 38 of platinum layer and titanium layer, a capacitor dielectric layer 39 composed of ferroelectric layer or high dielectric layer, and a top electrode 40 composed of platinum layer and titanium layer is formed on the insulating layer 37. Covering this capacitor 41, an interlayer insulating layer 42 composed of a PSG layer having the moisture content of 0.5 g or less per 1 cm$^3$ is formed. In the conventional semiconductor device having capacitor, the moisture content of the interlayer insulating layer was 0.9 g or more per 1 cm$^3$.

Above the integrated circuit 36, a first contact hole 43a reaching a diffusion region 33 is formed in the insulating layer 37 and interlayer insulating layer 42, and above the capacitor 41, a contact hole 43b reaching the bottom electrode 38 and a third contact hole 43c reaching the top electrode 40 are formed in the interlayer insulating layer 42. Through the first contact hole 43a, an interconnection 44a composed of aluminum layer or aluminum alloy layer connected to the diffusion region 33 is formed, and through the second and third contact holes 43b, 43c, interconnections 44b, 44c composed of aluminum layer or aluminum alloy layer connected to the bottom electrode 38 and top electrode 40 are formed. To protect these interconnections 44a, 44b, 44c, a passivation layer 45 composed of silicon nitride layer or silicon oxynitride layer is formed.

According to such constitution of Embodiment 1, in the interlayer insulating layer 42, the moisture content is controlled under 0.5 g per 1 cm$^3$, and if heated in the subsequent steps, diffusion of moisture into the capacitor dielectric layer 39 can be prevented, thereby preventing increase of leakage current and a drop in dielectric strength of the capacitor 41, so that a semiconductor device having the capacitor 41 hardly inducing trouble due to dielectric breakdown as compared with the prior art may be realized.

A manufacturing method of such semiconductor device is explained below while referring to the flow chart manufacturing method shown in FIG. 4, together with FIG. 3. First, at step (1), an integrated circuit 36 and others are formed on a silicon substrate 31. At step (2), an insulating layer 37 is formed on the silicon substrate 31. At step (3), a capacitor 41 is formed on the insulating layer 37. This capacitor 41 is formed by sequentially laminating a first conductive layer as bottom electrode 38, a capacitor dielectric layer 39, and a second conductive layer as top electrode 40, and patterning respectively by etching. As the capacitor dielectric layer 39, a ferroelectric layer or high dielectric layer is used, and as the bottom electrode 38 and top electrode 40, a two-layer composition consisting of a platinum layer and a titanium layer sequentially from the side contacting with the capacitor dielectric layer 39 is used. At step (4), the capacitor 41 is heated to enhance and stabilize the characteristic of the capacitor dielectric layer 39. At step (5), at least covering the capacitor 41 by CVD or the like, an interlayer insulating layer 42 composed of PSG layer (photo-silicate glass layer) is formed, and at step (6), the interlayer insulating layer 42 is heated in a nitrogen atmosphere, and the moisture contained in the interlayer insulating layer 42 is removed to not more than 0.5 g per 1 cm$^3$ of the interlayer insulating layer 42.

At step (7), a first contact hole 43a reaching the diffusion region 33 of the integrated circuit 36, and second and third contact holes 43b and 43c reaching the bottom electrode 38 and top electrode 40 of the capacitor 41 are formed. At step (8), interconnections 44a, 44b, 44c are formed, and at step (9), a passivation layer 45 composed of silicon nitride layer or silicon oxynitride layer high in humidity resistance is formed by plasma CVD.

In the foregoing constitution and manufacturing method, and PSG layer is formed as interlayer insulating layer 42 by CVD, and the moisture is removed from the PSG layer in a subsequent heat treatment process, but the invention is not limited to this, and for example, a silicon oxide layer may be formed in a condition of high temperature and reduced pressure, and heat treatment may be omitted.

Figure 4:
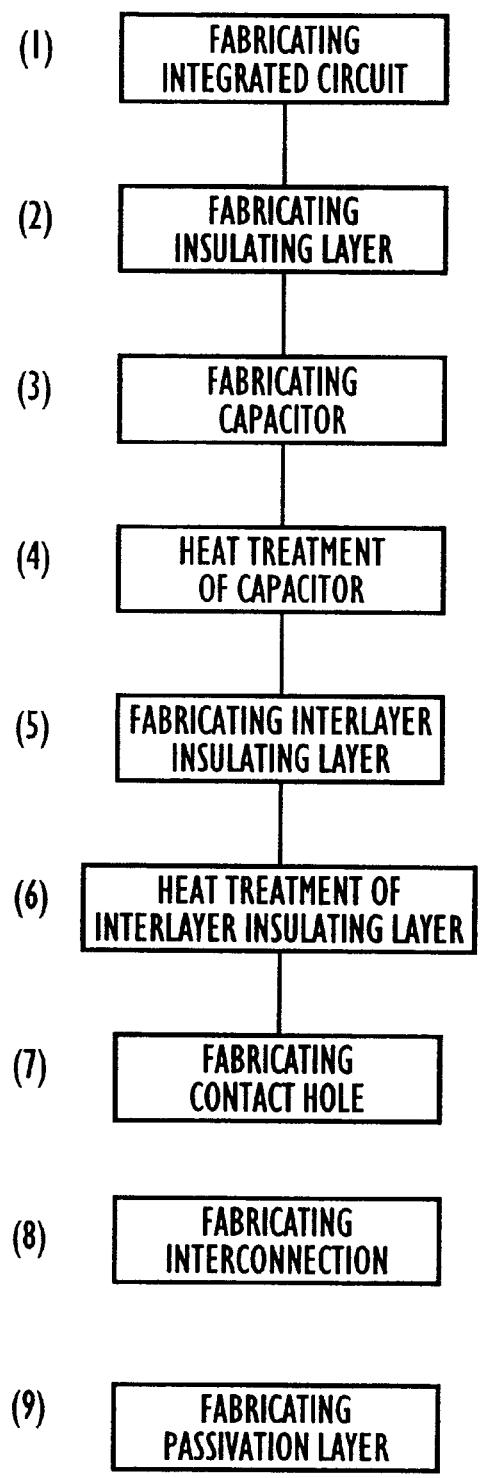
FIG. 4 is a flow chart for explaining a manufacturing method of a semiconductor device having capacitor in Embodiment 1 of the invention.

In the manufacturing method described above, heat treatment of the interlayer insulating layer 42 at step (6) in FIG. 4 is conducted in nitrogen gas, but it may be also done in inert gas such as helium and argon, or in vacuum.

Figure 5:
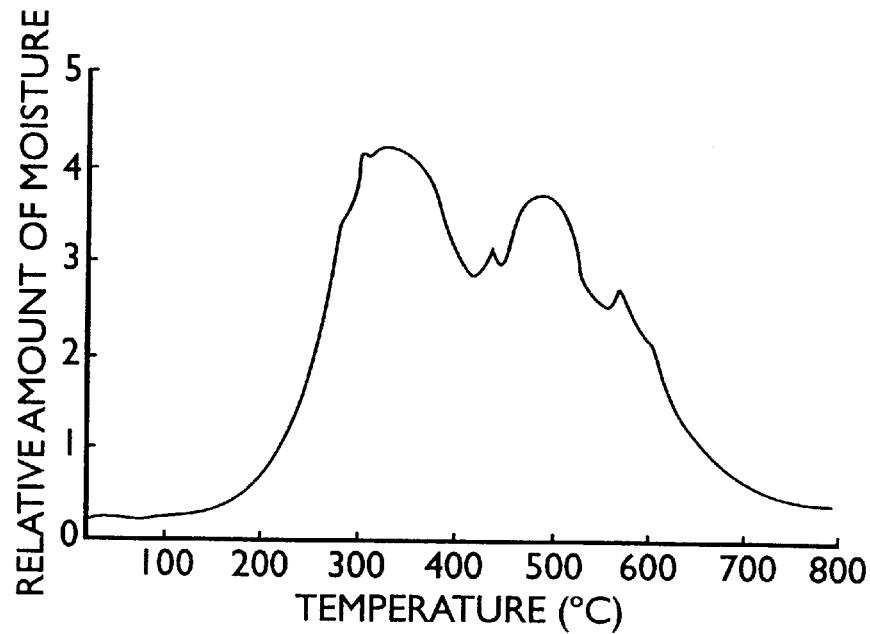
FIG. 5 is a diagram showing the temperature dependence of moisture release amount from PSG layer.

Results of measurement of moisture adsorption of PSG layer formed by CVD are explained below by reference to FIG. 5. The abscissa in FIG. 5 denotes the temperature, and the ordinate represents the amount of moisture released at the corresponding temperature, and their relation corresponds to the intensity of moisture adsorption. As shown in FIG. 5, the peak temperature of the adsorbed moisture releasing from the PSG layer is 300 to 350° C. in a first peak, and 450 to 530° C. in a second peak. The moisture corresponding to the second peak is adsorbed to the PSG layer with a sufficiently strong adsorption, and it seems to hardly affect the reliability in normal use. By contrast, the first peak drags its foot down to the low temperature side, and water is released in a condition relatively close to operating temperature, and it seems to induce deterioration of the capacitor dielectric layer 39.

The inventors discovered it preferable to heat at 350° C. or higher in order to release the adsorbed water corresponding to the first peak in FIG. 4 right after forming the layer by CVD. Furthermore, as the interlayer insulating layer 42, heat treatment of silicon oxide layer containing phosphorus by 6 wt % or less if found to be preferred also for lessening the stress applied to the capacitor 41. Besides, the above heat treatment is performed at a not higher temperature than temperature giving rise to deterioration of a characteristic of the integrated circuit. The deterioration generally occurs at about 90° C. It is preferably to heat at about 850° C. or lower.

Figure 6:
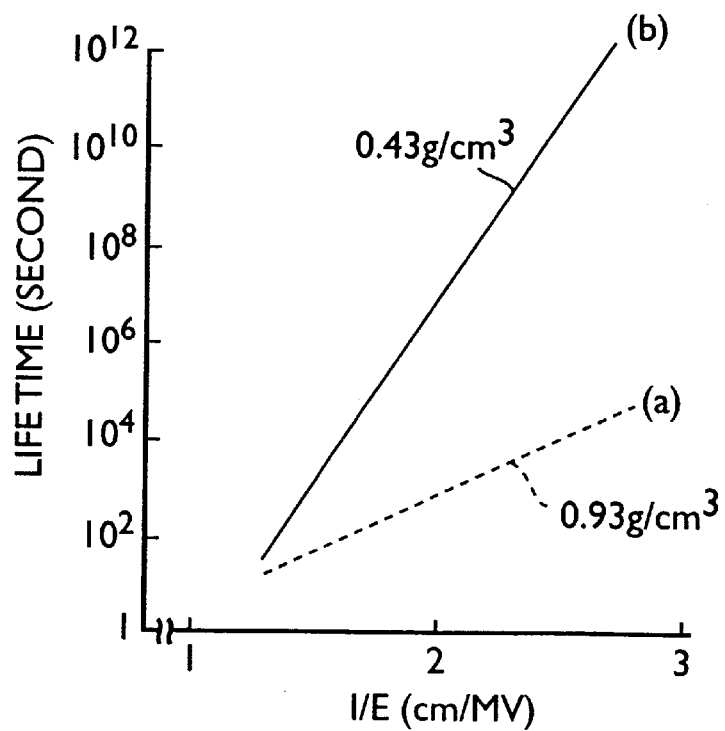
FIG. 6 is a diagram showing the electrical reliability of the semiconductor device having capacitor in Embodiment 1 of the invention.

The result of evaluation of reliability of the capacitor 41 manufactured in this embodiment is shown in FIG. 6. As the capacitor dielectric layer 39, barium strontium titanate was used. The abscissa denotes the inverse number of electric field applied to the capacitor 41, and the ordinate represents the time until the leakage current reaches a specific value. Line (a) shows the leakage current while applying a voltage to the capacitor 41 manufactured by a conventional method, and the moisture content of the PSG layer used as interlayer insulating layer 42 was 0.93 g/cm³. Line (b) relates to the result of the capacitor 41 manufactured in the embodiment, and the moisture content of the PSG layer as interlayer insulating layer 42 was 0.45 g/cm³. By comparing these lines, it has been proved that the capacitor 41 of the embodiment lower in the moisture content of the interlayer insulating layer 42 is superior by far as compared with the conventional example. Incidentally, the moisture content in the PSG layer may be 0.5 g/cm³ or less.

In the embodiment, after forming and heating the interlayer insulating layer 42, the contact holes 43a, 43b, 43c are formed, but the sequence of heat treatment may be changed in the order of formation of interlayer insulating layer 42, formation of contact holes 43a, 43b, 43c, and heat treatment. In such a case, the contact holes 43a, 43b, 43c serve as vent holes, and moisture adsorbed on the capacitor 41 is released easily.

In this embodiment, the interlayer insulating layer 42 is heated once, but the heat treatment may be divided in plural steps. For example, a first heat treatment may be given after forming the interlayer insulating layer 42, and a second heat treatment after forming the contact holes 43a, 43b, 43c. In this case, the heat treatment condition may be varied between the first and second heat treatment processes.

Embodiment 2

Figure 7:
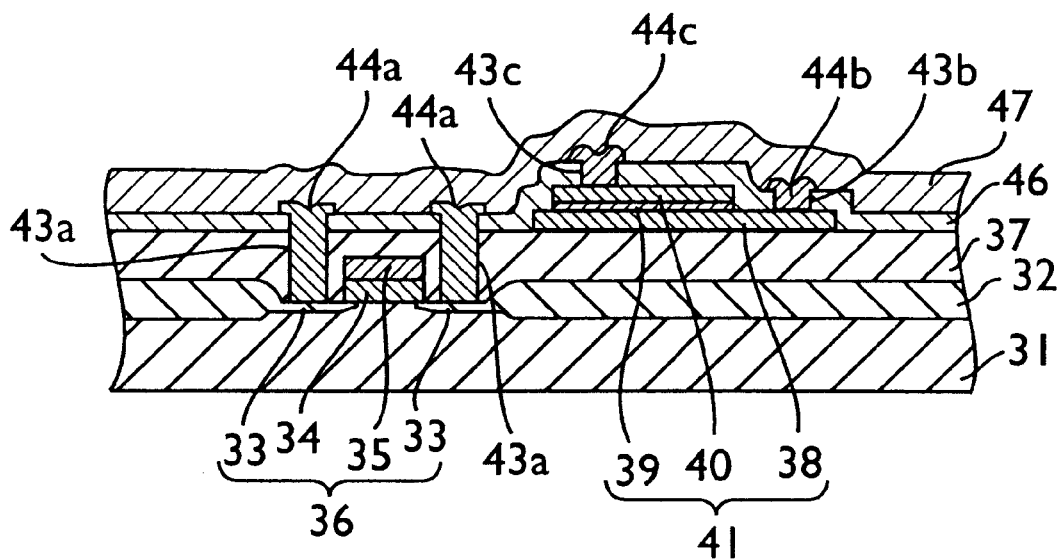
FIG. 7 is a partially sectional view showing the structure of principal parts of a semiconductor device having capacitor in Embodiment 2 of the invention.

A semiconductor device shown in FIG. 7 is a modified example of Embodiment 1 shown in FIG. 3. What differs between this embodiment and Embodiment 1 is that an interlayer insulating layer 46 composed of silicon oxide layer is formed on a capacitor 41, and that a passivation layer 47 composed of silicon nitride layer with hydrogen atom content of $10^{21}$ atoms/cm³ or less in the layer is formed for protecting interconnections 44a, 44b, 44c of aluminum layer or aluminum alloy layer.

According to the constitution of such Embodiment 2, as the interlayer insulating layer 46 contacting directly with the capacitor 41, a silicon oxide layer of low hydrogen content is used, and as the passivation layer 47, a silicon nitride layer with hydrogen atom content of $10^{21}$ atoms/cm³ or less is used, and therefore hydrogen does not permeate the capacitor dielectric layer 39, and invasion of water from outside into the silicon nitride layer used as passivation layer 47 can be prevented, so that a semiconductor device excellent in stability is realized.

In this embodiment, the passivation layer 47 is a single layer of silicon nitride layer with hydrogen content of $10^{21}$ atoms/cm³ or less, but by controlling the thickness of the passivation layer 47 at about 100 nm, if a lamination of silicon oxide layer, silicon nitride layer or silicon oxynitride layer thereon is used as passivation layer, the same effects are obtained.

Besides, by forming a silicon oxide layer beneath the passivation layer 47, the stress applied on the capacitor 41 can be decreased.

Figure 8:
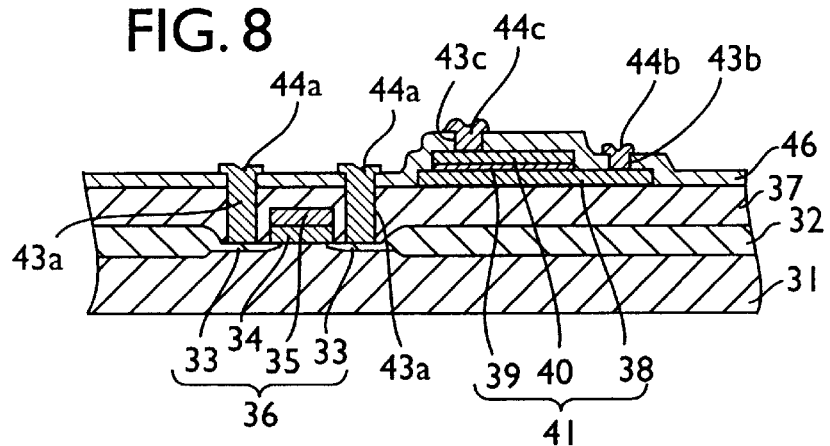

A manufacturing method of this semiconductor device is described below while referring to FIG. 8, FIG. 9 and FIG. 10. In FIG. 8, an integrated circuit 36 and others are formed on a silicon substrate 31, an insulating layer 37 is formed thereon, a capacitor 41 is formed on the insulating layer 37, an interlayer insulating layer 46 is formed to cover the capacitor 41, a first contact hole 43a, and second and third contact holes 43b and 43c are formed, and interconnections 44a, 44b, 44c are formed, which may be the same as in a conventional manufacturing method. Next, as shown in FIG. 9, a silicon nitride layer if formed by sputtering to be used as a passivation layer 47.

In this way, when sputtering is employed as forming method of passivation layer 47, a dense $Si_3N_4$ layer of stoichiometric composition can be formed relatively easily at low temperature of room temperature to 200° C., and damage will not be given to the interconnections 44a, 44b, 44c composed of aluminum layer or aluminum alloy laser. In sputtering, moreover, since the target and gas does not contain hydrogen atoms, activated hydrogen is not generated in the layer. The hydrogen atom concentration in the obtained silicon nitride layer is very low, under $10^{21}$ atoms/cm³, and if heated after forming the layer, hydrogen hardly diffuses into the capacitor dielectric layer 39 as far as under 400° C., and the characteristic of the capacitor 41 will not deteriorate.

Several methods are known for sputtering. For example, in the case of ion beam sputtering of reactive sputtering with nitrogen ions by using silicon target, it is possible to form a layer at room temperature. In the silicon nitride layer obtained by ion beam sputtering, the hydrogen atom concentration is very low, under $10^{21}$ atoms/cm³, which is equally compared with the silicon nitride layer formed at high temperature CVD at 800° C. Similar effects are expected in the RF sputtering using silicon nitride, ceramic target or silicon nitride power target, or RF planar magnetron sputtering.

Figure 9:
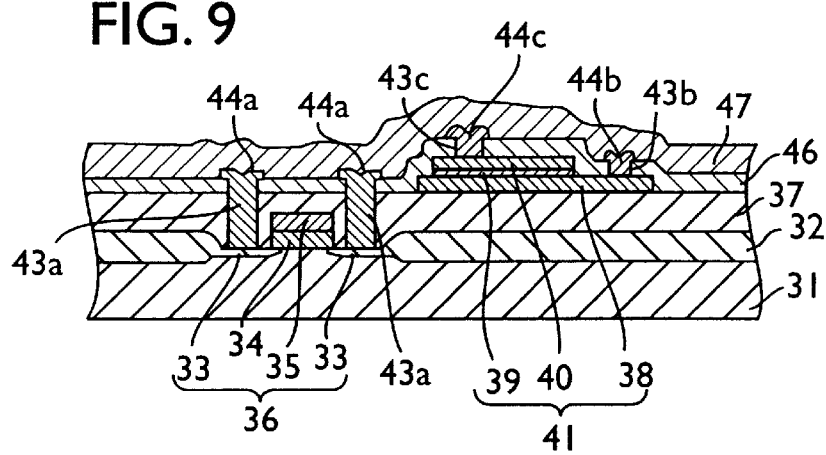
Figure 10:
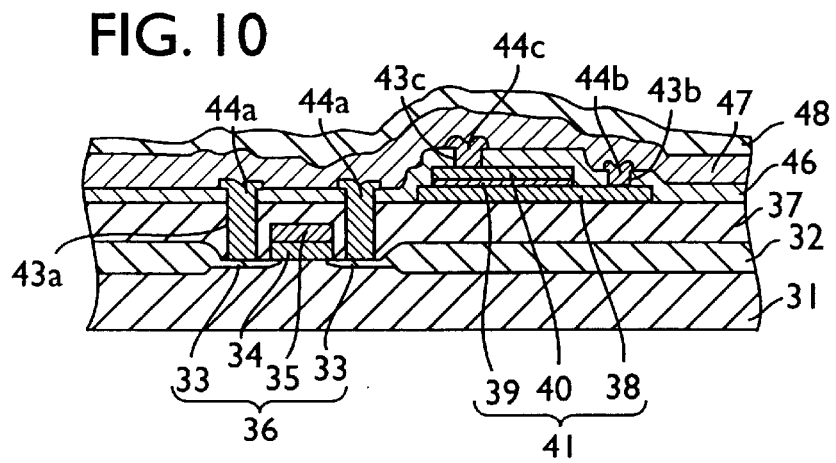

Moreover, as shown in FIG. 10, by forming a second passivation layer 48 made of silicon nitride layer by plasma CVD on the passivation layer 47 formed in the step shown in FIG. 9, the thickness of the silicon nitride layer by sputtering may be thin, so that the stress applied on the capacitor 41 can be decreased.

As the passivation layer 47, when a silicon nitride layer by sputtering method is used, by forming a silicon oxide layer beneath the passivation layer 47, the stress applied on the capacitor 41 can be further decreased.

Figure 11:
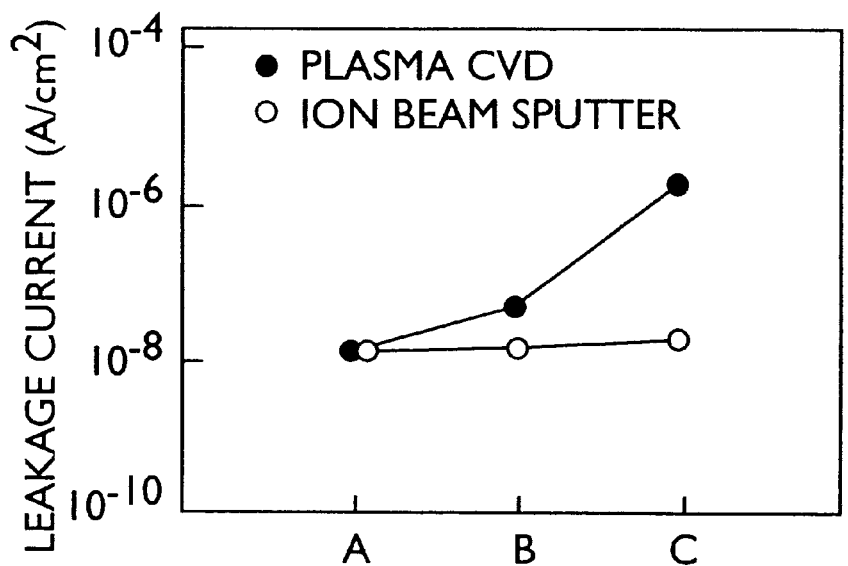
FIG. 11 is a diagram of measuring the leakage current of the capacitor at each step after forming interconnections of the semiconductor device having capacitor in Embodiment 2 of the invention.
Figure 12:
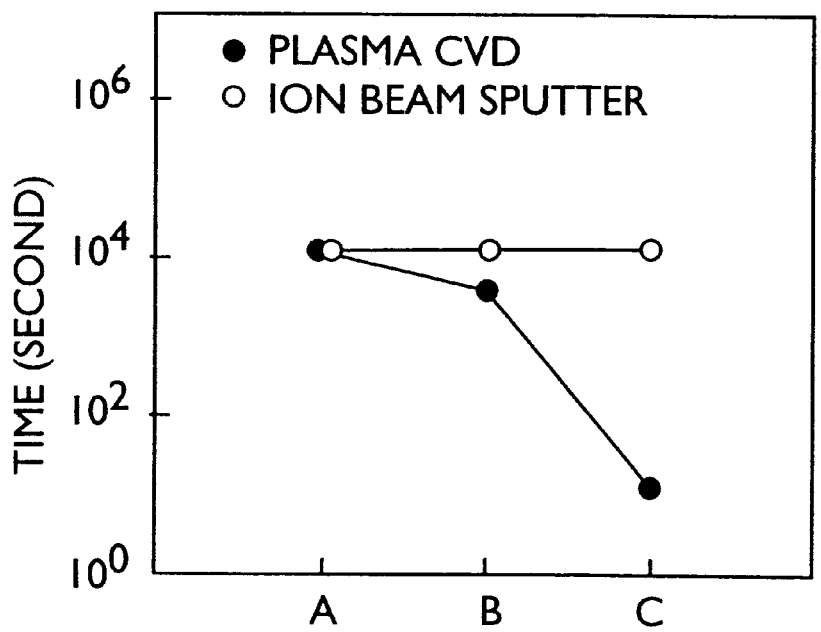
FIG. 12 is a diagram showing the relation between the applied voltage to capacitor and time to breakdown at each step after forming interconnections of the semiconductor device having capacitor in Embodiment 2 of the invention.

By using a barium titanate layer as the capacitor dielectric layer 39, characteristic changes of the capacitor 41 are described while referring to FIG. 11 and FIG. 12. In these diagrams, the axis of abscissas shows each step after forming the interconnections 44a, 44b, 44c, in which A is the value after forming the interconnections 44a, 44b, 44c, B is the value after forming the passivation layer 47, and C is the value after heating for 7 minutes at 380° C. in a mixed gas atmosphere of nitrogen and hydrogen after forming the passivation layer 47. The black circle is a case of forming a silicon nitride layer as passivation layer 47 by plasma CVD, and the while circle relates to a case of forming a silicon nitride layer as passivation layer 47 by ion beam sputtering. FIG. 11 shows the leakage current when a voltage of 1.5 V is applied to the capacitor 41, and FIG. 12 represents the time from application of voltage of 1 MV/cm to the capacitor dielectric layer 39 at 125° C. until breakdown.

As shown in FIG. 11, as a matter of course, in the case A after forming the interconnections 44a, 44b, 44c, the leakage current is unchanged at $10^{-8}$ A/cm² regardless of the forming method of silicon nitride layer, but in the case B after forming silicon nitride layer on the interconnections 44a, 44b, 44c, the leakage current increases in the sample forming silicon nitride layer by plasma CVD. This seems because much activated hydrogen is present in the plasma in plasma CVD, and invades into the capacitor dielectric layer 39 in the layer forming process, thereby deteriorating the ferroelectric layer or high dielectric layer composing the capacitor dielectric layer 39. Further, in the case C after heat treatment, the leakage current is further increased in the sample forming a silicon nitride layer by plasma CVD. By contrast, in the samples formed by ion beam sputtering, there is no difference in the leakage current among samples after steps A, B and C.

Incidentally, as shown in FIG. 12, in the sample forming a silicon nitride layer by plasma CVD, the time to dielectric breakdown becomes shorter after every step, which also seems because hydrogen atoms in the passivation layer 47 invade into the capacitor dielectric layer 39 to deteriorate the ferroelectric layer or high dielectric layer for composing the capacitor dielectric layer 39.

By contrast, in the samples formed by ion beam sputtering, there is no difference in time to dielectric breakdown among samples after steps A, B, and C.

In this embodiment, the interconnections 44a, 44b, 44c are constituted of a single layer of aluminum layer or aluminum alloy layer, and by forming a titanium-tungsten layer beneath these layers, the adhesion is improved when a platinum layer is used as an electrode of the capacitor 41, so that the contact resistance can be decreased.

Embodiment 3

Figure 13:
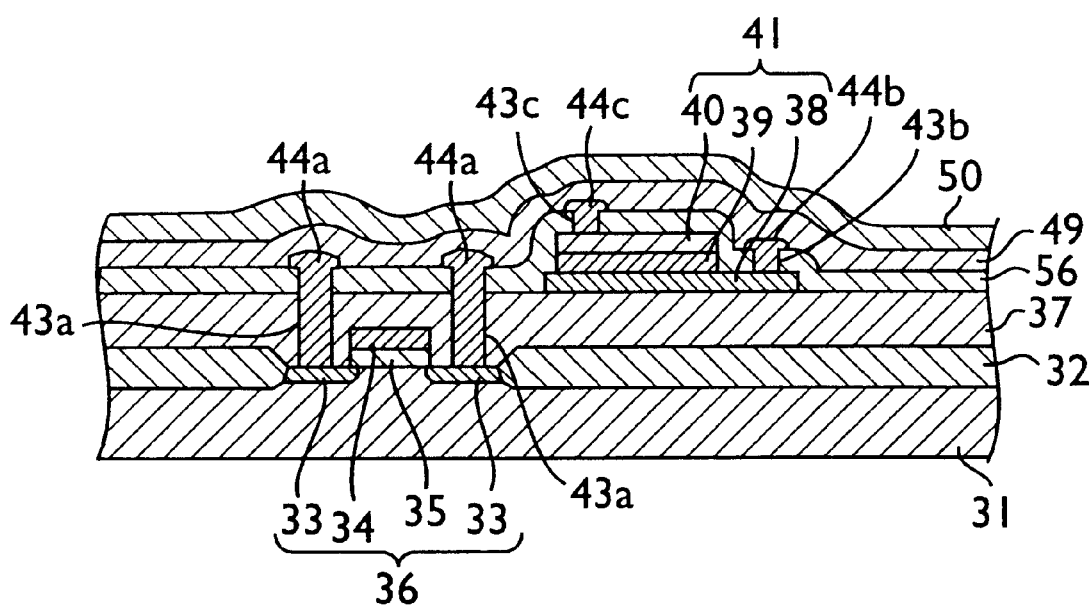
FIG. 13 is a partially sectional view showing the structure of principal parts in a semiconductor device having capacitor in Embodiment 3 of the invention.

A semiconductor device shown in FIG. 13 is another modified example of Embodiment 1 shown in FIG. 3. What differs between this embodiment and Embodiment 1 is that a multilayer passivation layer consisting of a first passivation layer 49 of PSG layer and a second passivation layer 50 of NSG layer (non-doped silicate glass layer) is formed in order to protect the interconnections 44a, 44b, 44c. The first passivation layer 49 and second passivation layer 50 are formed by other method than plasma CVD in which active hydrogen is produced in layer forming process, for example, low-pressure CVD or atmospheric-pressure CVD.

In such constitution of Embodiment 3, unlike the silicon nitride layer or silicon oxynitride layer formed by the conventional plasma CVD, hydrogen is not contained in the passivation layer, so that the capacitor dielectric layer will not deteriorate. Furthermore, stress relaxation to the capacitor is realized by the PSG layer, and the moisture absorption which is a demerit of PSG layer can be prevented by the NSG layer formed thereon, so that a high reliability is realized without stress applied on the capacitor.

Figure 14:
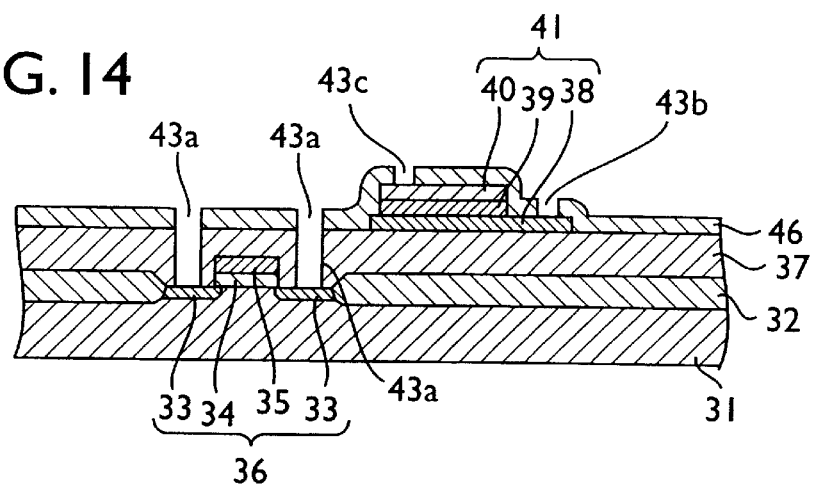
Figure 15:
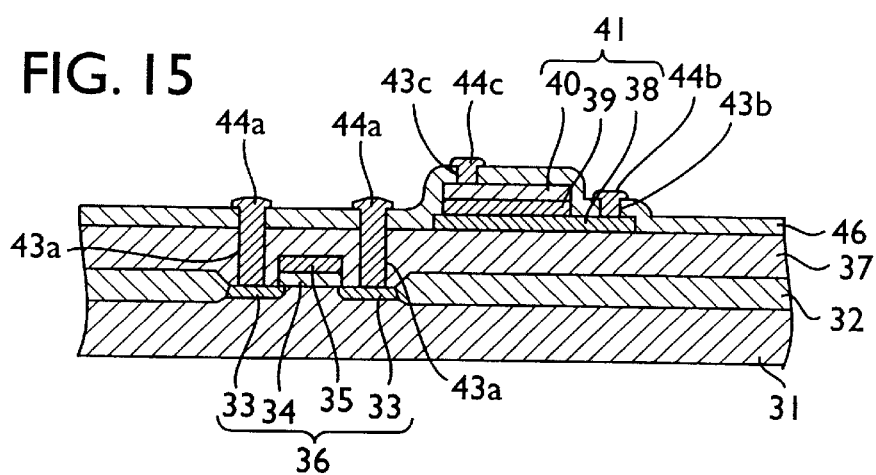
Figure 16:
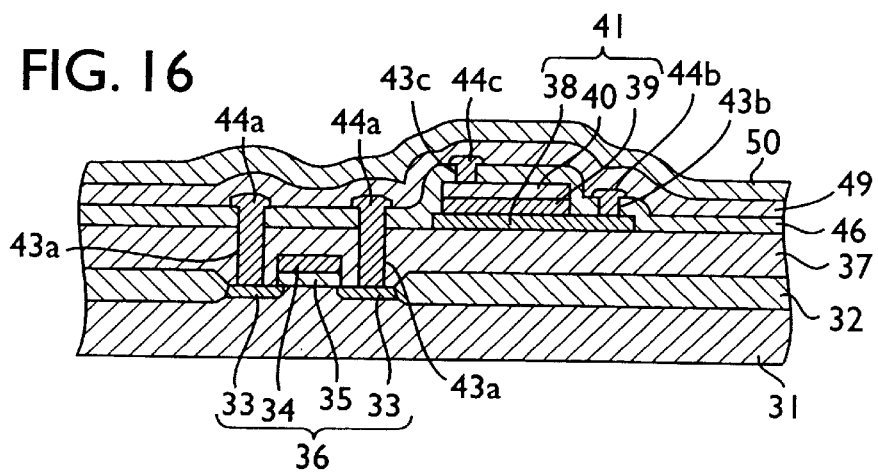

A manufacturing method of this semiconductor device is described below with reference to FIG. 14, FIG. 15, and FIG. 16. In FIG. 14, an integrated circuit 36 and others are formed on a silicon substrate 31, an insulating layer 37 is formed thereon, a capacitor 41 is formed on the insulating layer 37, an interlayer insulating layer 46 is formed to cover the capacitor 41, a first contact hole 43a, and second and third contact holes 43b and 43c are formed, which may be the same as in a conventional manufacturing method. Then, as shown in FIG. 15, interconnections 44a, 44b, 44c are formed. Next, as shown in FIG. 16, covering the interconnections 44a, 44b, 44c, a first passivation layer 49 made of PSG layer and a second passivation layer 50 made of NSG layer are sequentially formed by low-pressure CVD. Or the first passivation layer 49 and second passivation layer 50 may be also formed by atmospheric-pressure CVD.

Embodiment 4

Figure 17:
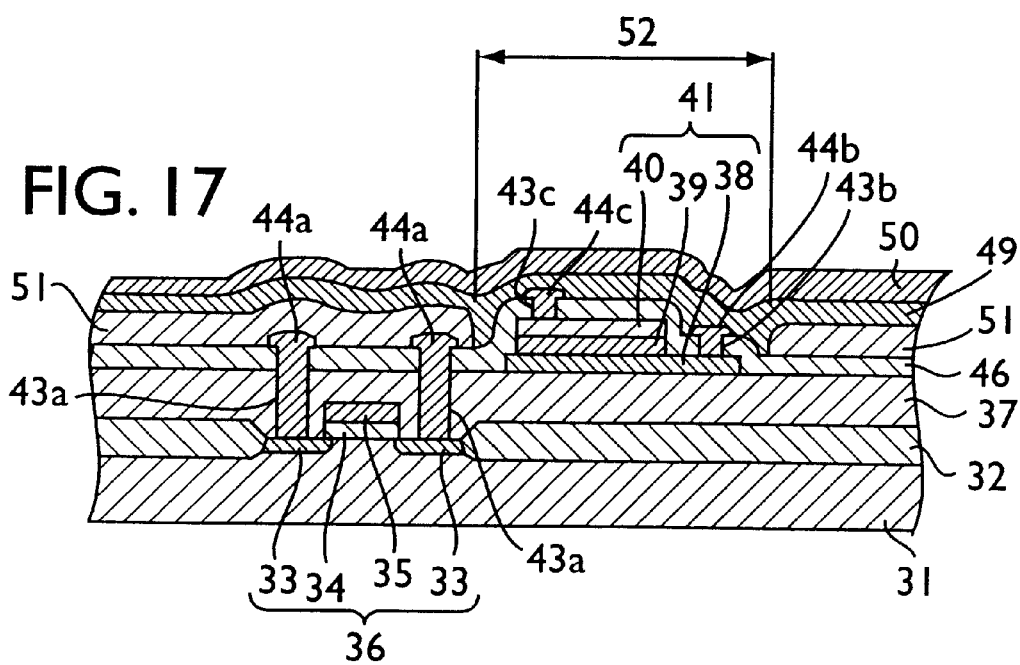
FIG. 17 is a partially sectional view showing the structure of principal parts of a semiconductor device in Embodiment 4 of the invention.

FIG. 17 shows a modified example of Embodiment 3 shown in FIG. 13. What differs between this embodiment and Embodiment 3 is that a second interlayer insulating layer 51 composed of silicon nitride layer or silicon oxynitride layer possessing an opening 52 corresponding to the capacitor 41 is formed beneath the first passivation layer 49.

In such constitution, deterioration of the integrated circuit 36 can be prevented by the second interlayer insulating layer 51 composed of silicon nitride layer, which is favorable to the integrated circuit. On the capacitor 41, the first passivation layer 49 composed of PSG layer and second passivation layer 50 composed of NSG layer are formed, and therefore the stress applied on the capacitor 41 is alleviated and the invasion of ionic impurities from outside is prevented by the first passivation layer 49, while the moisture resistance and water resistance which the PSG layer is not so good with are assured by the second passivationlayer 50.

Figure 18:
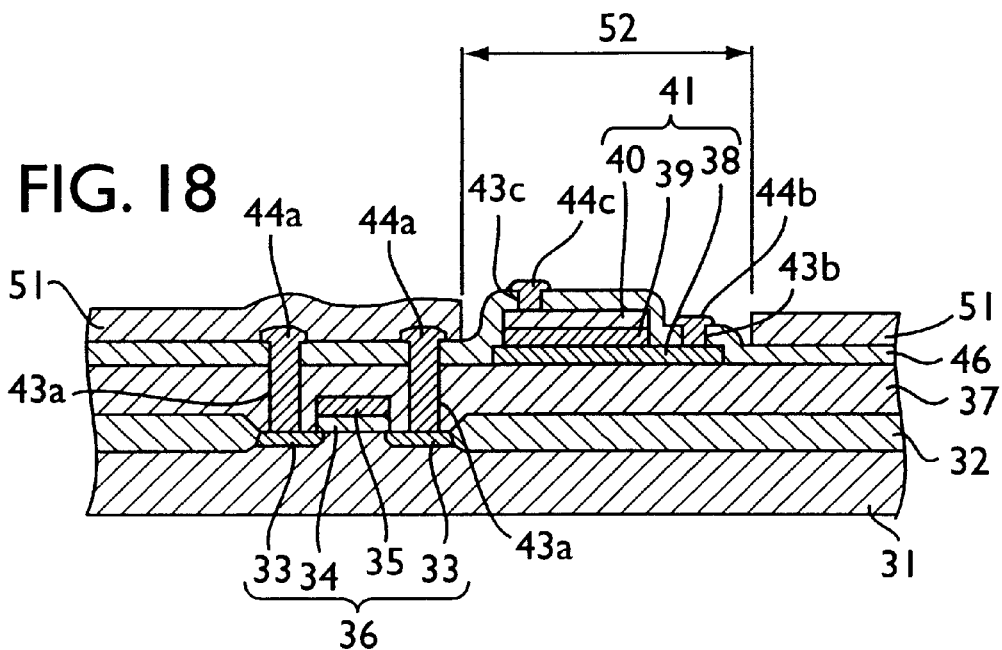
Figure 19:
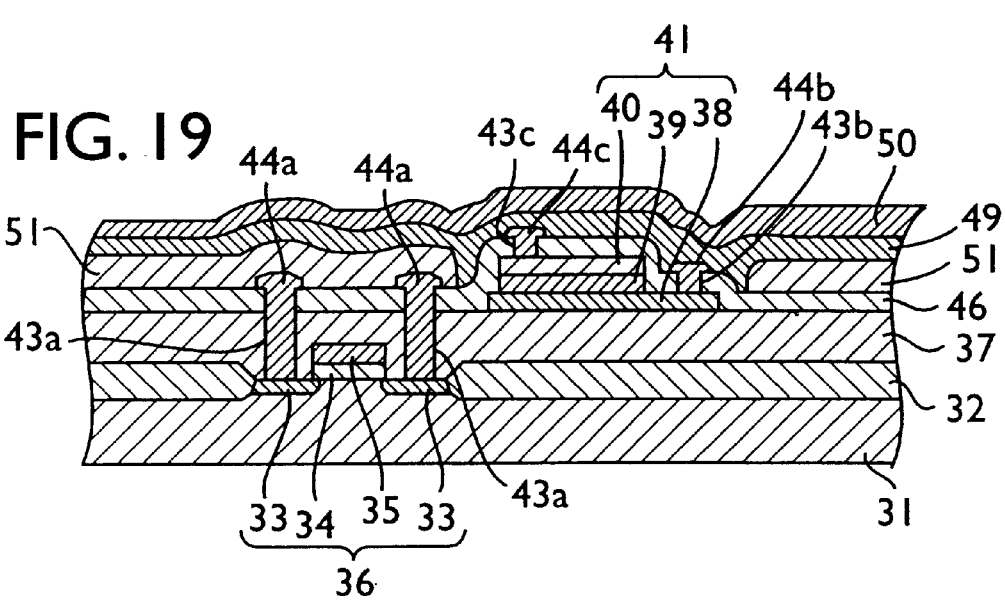

A manufacturing method of the semiconductor device shown in FIG. 17 is explained below while referring to FIG. 18 and FIG. 19. After forming the interconnections 44a, 44b, 44c shown in FIG. 15, a second interlayer insulating layer 51 composed of silicon nitride layer or silicon oxynitride layer is formed so as to cover the interconnections 44a, 44b, 44c. Consequently, as shown in FIG. 18, an opening 52 corresponding to the capacitor 41 is formed by conventional etching method. Then, as shown in FIG. 19, on the entire surface, a first passivation layer 49 composed of PSG layer and a second passivation layer 50 composed of NSG layer are sequentially formed by low-pressure CVD or atmospheric-pressure CVD.

As the second interlayer insulating layer 51, a dense silicon nitride layer is formed by plasma CVD at low temperature, and an opening 52 corresponding to the capacitor 41 is formed in the second interlayer insulating layer 51, and the capacitor 41 is heated, so that the hydrogen taken in the layer in the process of forming the silicon nitride layer can be released.

A greater effect may be obtained by heating the capacitor 41 in two steps, that is, first heat treatment process of heating in inert gas or vacuum, and second heat treatment process of heating in gas containing oxygen. That is, the hydrogen in the capacitor dielectric layer 39 is released in the first heat treatment process, and oxygen is introduced in the second heat treatment process, thereby recovering the characteristic of the capacitor dielectric layer 39.

In this embodiment, the opening 52 corresponding to the capacitor 41 is formed in the second interlayer insulating layer 51, but the opening 52 may be also provided in correspondence to the top electrode 40, instead of the entire capacitor 41, and the hydrogen in the capacitor dielectric layer 39 can be similarly released in the heat treatment process.

Embodiment 5

Figure 20:
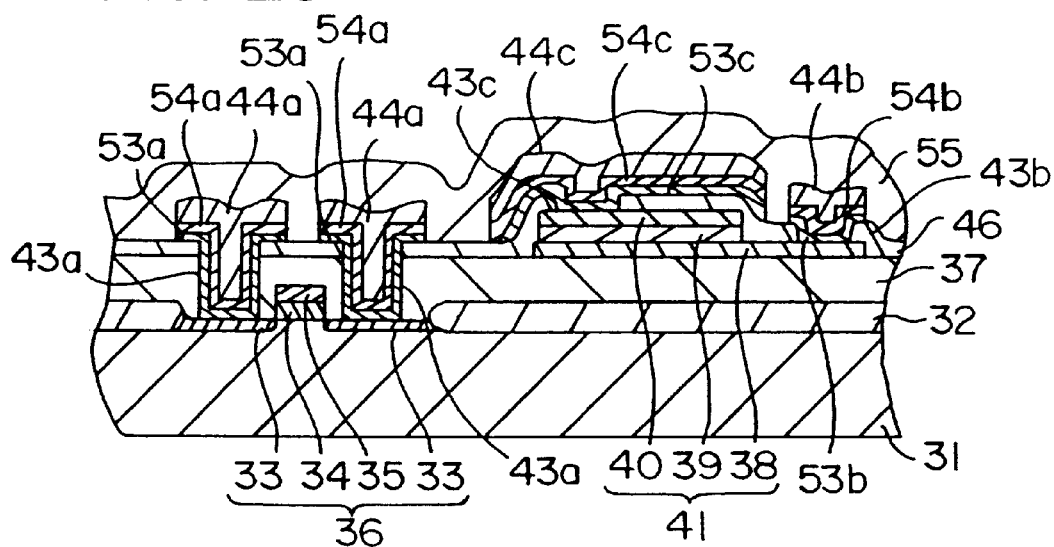
FIG. 20 is a partially sectional view showing the structure of principal parts in a semiconductor device having capacitor in Embodiment 5 of the invention.

A semiconductor device shown in FIG. 20 is a modified example of Embodiment 2 shown in FIG. 7. What differs between this embodiment and Embodiment 2 is that first conductive layers 53a, 53b, 53c made of titanium layer and second conductive layers 54a, 54b, 54c made of titanium nitride layer are formed beneath interconnections 44a, 44b, 44c, including first contact hole 43a, second contact hole 43b, and third contact hole 43c, and that the top of the capacitor 41 is covered with the first conductive layer 53c, second conductive layer 44c, and interconnection 44c through an interlayer insulating layer 46, forming a passivation layer 55 composed of silicon nitride layer or silicon oxynitride layer, covering the interconnections 44a, 44b, 44c.

In such constitution of Embodiment 5, when a layer not passing hydrogen is selected as the second conductive layer 54c, if a silicon nitride layer or a silicon oxynitride layer is formed as passivation layer 55 by plasma CVD, reduction of the capacitor dielectric layer 39 by hydrogen atoms, radicals, or ions in the plasma can be prevented.

As the first conductive layers 53a, 53b, 53c, titanium layers or titanium-tungsten layers are preferably, and as the second conductive layers 54a, 54b, 54c, titanium nitride layers are preferably. Or, by using a combination of first conductive layer 53c and interconnection 44c in the layer covering over the capacitor 41, and omitting the second conductive layer 54c, deterioration of the capacitor dielectric layer 39 may be prevented in the process of forming the passivation layer 55 as compared with the prior art.

Embodiment 6

Figure 21:
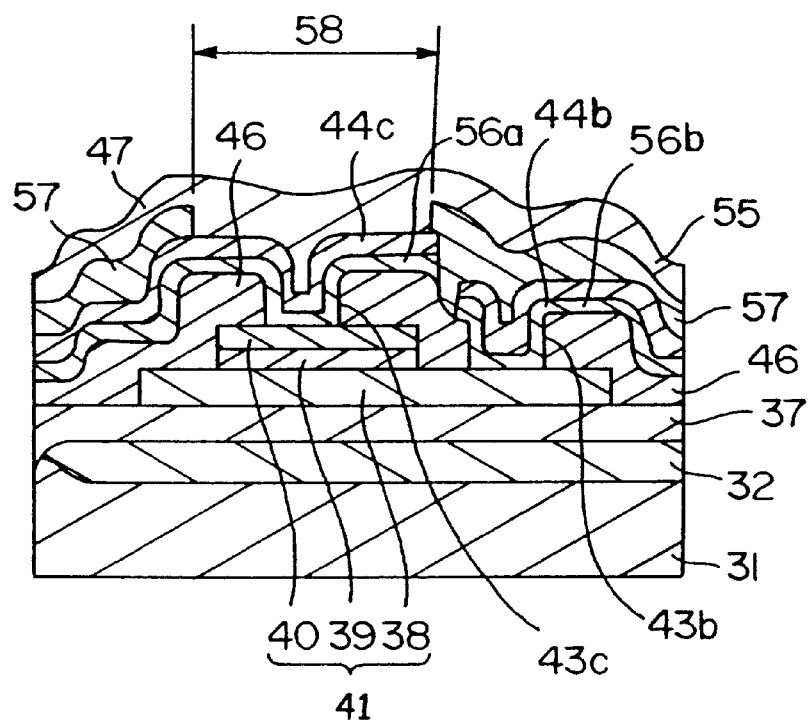
FIG. 21 is a partially sectional view showing the structure of a capacitor in a semiconductor device in Embodiment 6 of the invention.

FIG. 21 is a modified example of Embodiment 5, and integrated circuit and others not related directly with the embodiment are omitted in the drawing. What differs between this embodiment and Embodiment 5 is that the top of the capacitor 41 is covered with a first conductive layer 56a and an interconnection 44c through an interlayer insulating layer 46, and that the first conductive layer 56a and interconnection 44c are partly overlapped in the peripheral part of the capacitor 41, and also that a second interlayer insulating layer 57 composed of silicon nitride layer possessing an opening 58 corresponding to the top electrode 40 of the capacitor 41 is provided.

In such constitution, invasion of water from the top of the capacitor 41 is blocked by the first conductive layer 56a composed of titanium-tungsten layer or the like, while the other regions are shut off by the second interlayer insulating layer 57 composed of silicon nitride layer or the like, so that the reliability about humidity resistance and water resistance may be more effectively enhanced.

Embodiment 7

FIG. 22, FIG. 23, FIG. 24, FIG. 25, and FIG. 26 are diagrams for explaining the manufacturing process of the semiconductor device having a second interlayer insulating layer 59 attached to Embodiment 1.

Figure 22:
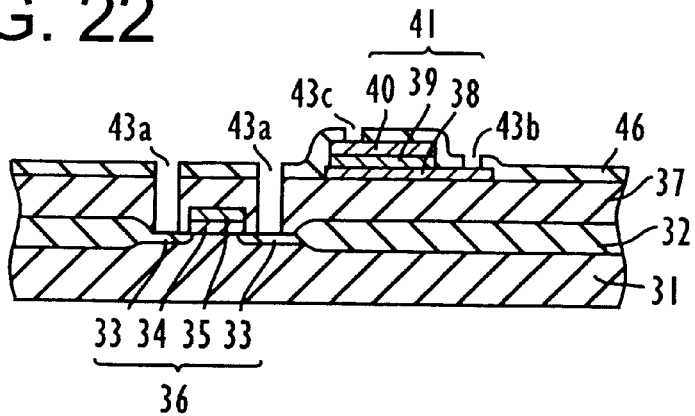

First, as shown in FIG. 22, an insulating layer 37 is formed on a silicon substrate 31 in which an integrated circuit 36 is fabricated, and a capacitor 41 is formed on the insulating layer 37, and an interlayer insulating layer 46 such as silicon oxide layer is formed to cover the capacitor 41, and first contact hole 43a, a second contact hole 43b, and third contact hole 43c are formed. As the bottom electrode 38 and top electrode 40 of the capacitor 41, a platinum layer having a titanium layer placed on the other side the capacitor is used.

Figure 23:
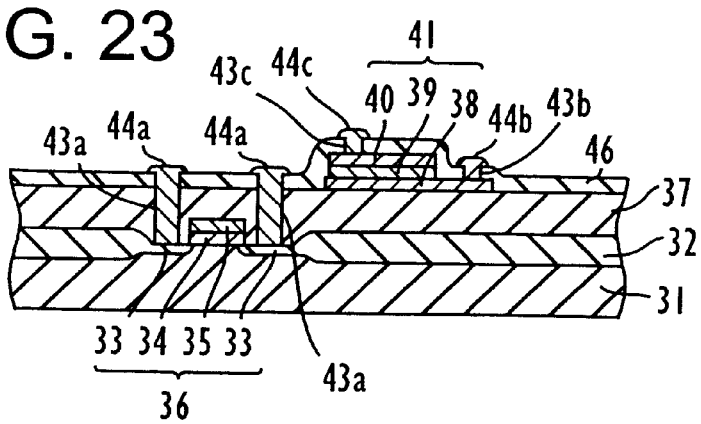
Figure 24:
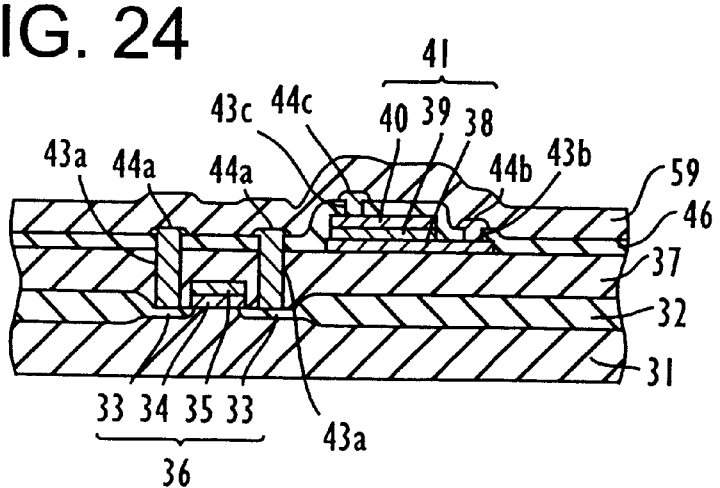

Next, as shown in FIG. 23, after forming interconnections 44a, 44b, 44c, a second interlayer insulating layer 59 composed of silicon nitride layer or silicon oxynitride layer is formed on the entire surface by plasma CVD or the like as shown in FIG. 24. Next, as shown in FIG. 25, an opening 60 corresponding to the capacitor 41 is formed in the second interlayer insulating layer 59 on the top of the capacitor 41. In this state, in order to take hydrogen or hydrogen compound away from the capacitor dielectric layer 39, heat treatment is applied by using nitrogen, argon, or their mixed gas, or in vacuum. Successive to this heat treatment, in order to supply oxygen into the capacitor dielectric layer 39, heat treatment is applied by using oxygen, or mixed gas of oxygen with nitrogen, or with argon or the like. Then, as shown in FIG. 26, a passivation layer 55 composed of silicon nitride layer or organic insulating layer is formed.

According to the constitution of such Embodiment 7, after removing the second interlayer insulating layer 59 on the capacitor 41, heat treatment of the capacitor 41 (that is, heat treatment of capacitor dielectric layer 39) is effected in nitrogen, argon, or their mixed gas, or in vacuum, at 400° C. or less, thereby easily releasing hydrogen or hydrogen compound, which causes deterioration of ferroelectric layer or high dielectric layer. By successively performing heat treatment, using oxygen, or mixed gas of oxygen with nitrogen, argon, or the like, at 400° C. or less, the vacancy of oxygen greatly contributing to the electric conductivity of ferroelectric layer or high dielectric layer may be filled up.

Results of measurement of leakage current and results of dielectric breakdown characteristics of capacitor dielectric layer 39 before and after forming silicon nitride layer on the capacitor 41 and after heat treatment are explained below while referring to FIG. 27 and FIG. 28.

Figure 27:
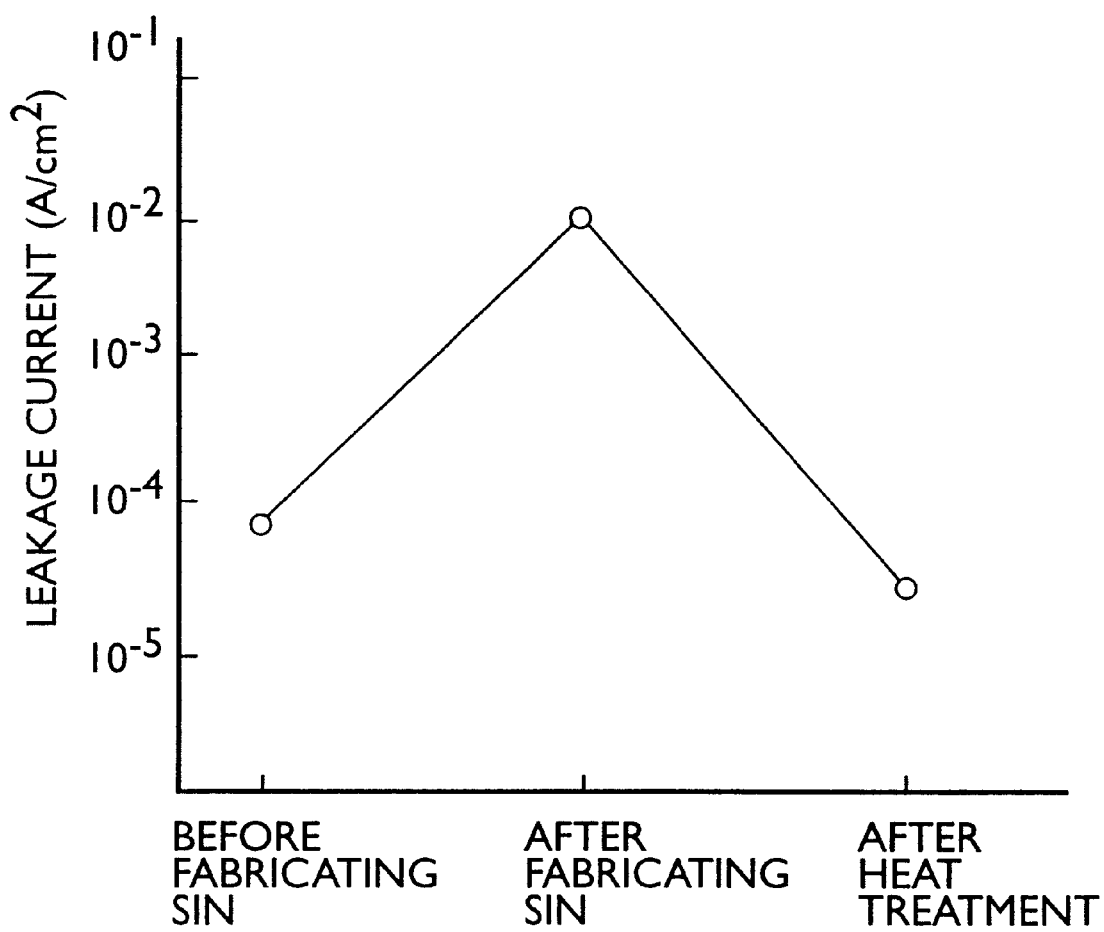
FIG. 27 is a diagram showing the result of measuring the leakage current after each step of a semiconductor device having capacitor at Embodiment 7 of the invention.

FIG. 27 shows the result of measurement of leakage current when barium strontium titanate layer is used as the capacitor dielectric layer 39, in which after the silicon nitride layer is formed by plasma CVD as the second interlayer insulating layer 59, the leakage current has taken a figure up about two places, but by heat treatment, the leakage current takes a figure down two or three places, returning to the state before forming the silicon nitride layer.

Figure 28:
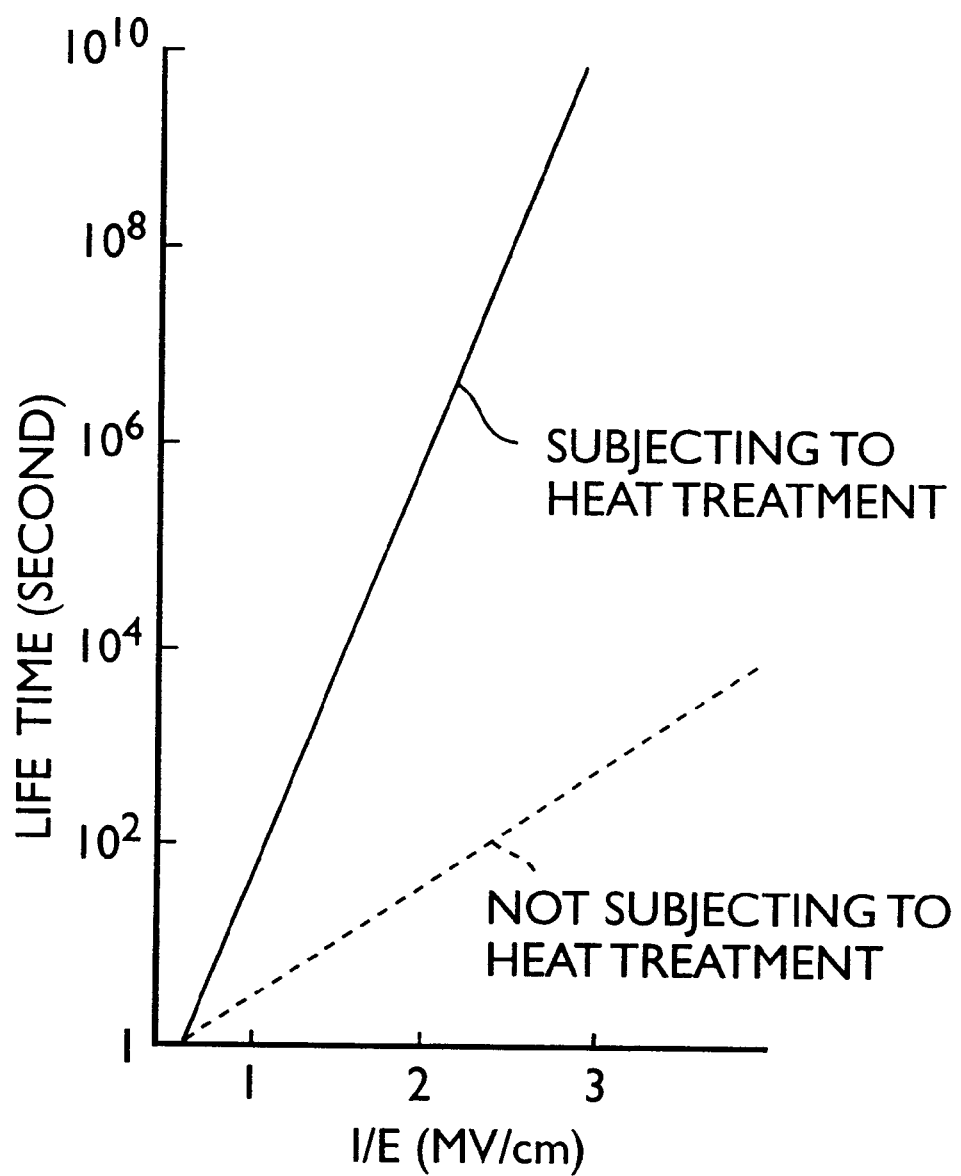
FIG. 28 is a diagram showing the electrical reliability of semiconductor device having capacitor in Embodiment 7 of the invention.

FIG. 28 shows the relation between the inverse number of the electric field intensity E (MV/cm) applied to the capacitor 41 and the lifetime, in which a broken line refers to the lifetime when a silicon nitride layer is formed as the second interlayer insulating layer 59 and heat treatment is not given, and a solid line shows the lifetime when a silicon nitride layer is formed as the second interlayer insulating layer 59 and heat treatment is given. In any case, the silicon nitride layer is formed by plasma CVD.

In this way, by heating after forming the silicon nitride layer or silicon oxynitride layer as the second interlayer insulating layer 59 by plasma CVD method, the lifetime to dielectric breakdown at high temperature and in high electric field deteriorating in the plasma CVD process can be recovered to a sufficiently practical level.

In the manufacturing method of semiconductor device herein, an example of heating the capacitor 41 before and after forming the interconnections 44a, 44b, 44c has been explained, but similar effects may be obtained by other method, for example, by forming first, second and third contact holes 43a, 43b, 43c shown in FIG. 22, heating in nitrogen, argon, or their mixed gas or in vacuum in order to take hydrogen or hydrogen compound away from the capacitor dielectric layer 39, and successively heating by using oxygen, or mixed gas of oxygen with nitrogen, argon or the like in order to supply oxygen into the capacitor dielectric layer 39. In this case, as the second interlayer insulating layer 59, it is preferred to use a layer formed in other method than plasma CVD. In this case, the heat treatment before and after forming the interconnections 44a, 44b, 44c required in the above manufacturing method is not necessary.

In one embodiment, an example of forming an opening 60 corresponding to the capacitor 41 in the second interlayer insulating layer 59 is explained, but the opening 60 may be also provided in correspondence with the top electrode 40 of the capacitor 41, and it is possible to release the hydrogen or hydrogen compound in the capacitor dielectric layer 39 in the heat treatment process.

The invention is not limited to the illustrated embodiments alone. Modified examples falling within the true spirit and scope of the invention are all included in the scope of the claims.

What is claimed is:

1. A semiconductor device comprising an integrated circuit and a capacitor formed on the integrated circuit, said capacitor comprising a bottom electrode composed of a conductive layer formed on an insulating layer of the integrated circuit, a capacitor dielectric layer composed of one of a ferroelectric layer and dielectric layer having high permittivity formed on the bottom electrode, and a top electrode composed of a conductive layer formed on the capacitor dielectric layer, an interlayer insulating layer formed so as to cover said capacitor, said interlayer insulating layer having contact holes formed therein, said contact holes exposing said top electrode and said bottom electrode, interconnections formed in said contact holes and electrically coupled to said top electrode and said bottom electrode, and a passivation layer is formed to cover the interconnections, said interconnections include a first layer comprising titanium-tungsten, wherein a silicon nitride layer possessing an opening in the part correspondig to the top electrode of the capacitor is provided beneath the passivation layer.

2. The semiconductor device as recited in claim 1, wherein said first layer at least partially engages said top electrode.

* * * * *